Dec. 3, 1968 J. O. BOWERS, JR 3,414,737

FIELD EFFECT TRANSISTOR GATING CIRCUIT

Filed Sept. 8, 1965

INVENTOR.
John O. Bowers, Jr.
BY
B. B. Olive
ATTORNEY 3,414,737
FIELD EFFECT TRANSISTOR GATING CIRCUIT John Oliver Bowers, Jr., Maitland, Fla., assignor to Dynatronics, Inc., Orlando, Fla., a corporation of Florida Filed Sept. 8, 1965, Ser. No. 485,762
8 Claims. (Cl. 307—243)

ABSTRACT OF THE DISCLOSURE

A field effect transistor (FET) gating circuit is disclosed which has the features of precluding the flow of gate current when the FET is enabled while simultaneously discharging the inherent source to gate and drain to gate capacitances of the FET. A diode is connected between a source of inhibiting voltage and the gate electrode of the FET. A driver transistor is connected via a diode to the gate electrode. When the driver transistor is saturated, the gate electrode is connected to ground and the field effect transistor is enabled. A discharge circuit for the inherent capacity of the field effect transistor and for containing isolation between the gate electrode and the source of analog signals being gated includes a capacitor connected between the source of inhibiting voltage and ground through a diode and a discharge transistor connected between the gate electrode and the junction of the capacitor and diode. When the driver transistor is saturated, the discharge transistor is rendered conductive, thereby establishing a path for rapidly discharging the inherent capacitances of the FET instantaneously at the onset of the command level which saturates the driver transistor. The capacitor in the discharge circuit also discharges. It, however, controls the discharge through the other transistor so that the discharge path is open only at the onset of the command signal level. When the capacitor discharges to the diode cutoff voltage, conduction through the discharge transistor stops. By virtue of the diode and the inhibited discharge transistor, there are no paths to ground from the gate electrode of the FET. Thus, current flow through the gate electrode by virtue of the source driving current are precluded.

This invention is concerned with field effect transistor circuitry and more specifically with a circuit which may be employed to gate a field effect transistor. The circuit finds special application as an analog gate driver circuit where a field effect transistor is being employed as a gate between an analog source and a drain or output line.

A general object of the present invention is to provide a solid state switching device which is compatible with both integrated or monolithic as well as discrete forms of circuits.

A more specific object is to provide a field effect transistor switching circuit which may be made in discrete form but which is uniquely suited to integrated circuit form for analog switching application.

Another object is to provide for a solid state switching element having the character of a field effect transistor an isolation circuit which establishes a high degree of isolation between the input or command signal to the element and the source, such as an analog source, connected to the element.

Another object is to provide a solid state switching circuit having a good dynamic response, that is, an ability to turn off and on at a rapid rate without having to recover after each operation as in the "Bright" transformer type switching circuit.

Another object is to provide for a switching element having the caracter of a field effect transistor, a gating circuit which minimizes or eliminates any transient loading or "spike" effect when the source, such as an analog source, is conducting through the switching element.

The foregoing and other objects will appear in connection with the description to follow and in the drawings in which.

Figure 1:
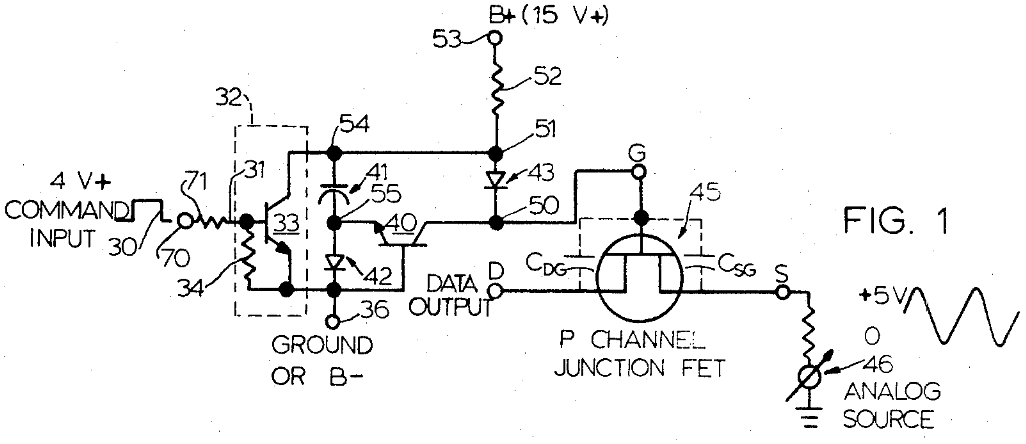
FIGURE 1 is a gate driver circuit embodying the invention as applied to a P channel junction field effect transistor.

The invention will be explained in connection with its application to a P channel junction field effect transistor as in FIGURE 1 and from this operation of the invention as applied to an N junction field effect transistor as in FIGURE 2 will be readily understood. While explained specifically in connection with the field effect type transistor, those skilled in the art will also readily appreciate after reading the following description and referring to the drawings that the invention and its teachings may be applied to any other switching element which exhibits essentially the same or equivalent character as that of a field effect transistor. The field effect transistor, for example, is particularly unique in having an inherent source to gate capacitance and drain to gate capacitance and the circuitry of the invention is especially adapted to deal with a solid state switching element having this capacitance characteristic. It may also be mentioned that while a switching device made according to the invention is especially adapted to integrated circuit form and to analog switching such device is equally adapted to discrete circuit form and other switching applications.

Figure 2:
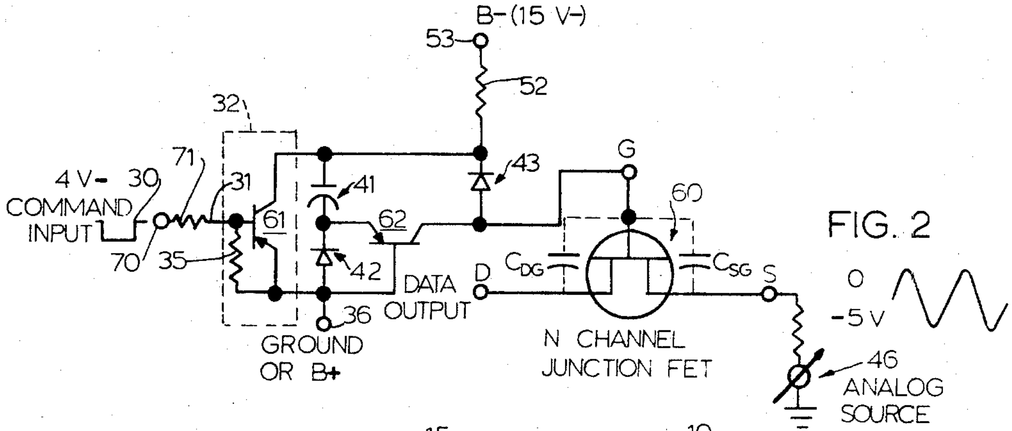
FIGURE 2 is a gate driver circuit embodying the invention as applied to an N channel junction field effect transistor.
Figure 3:
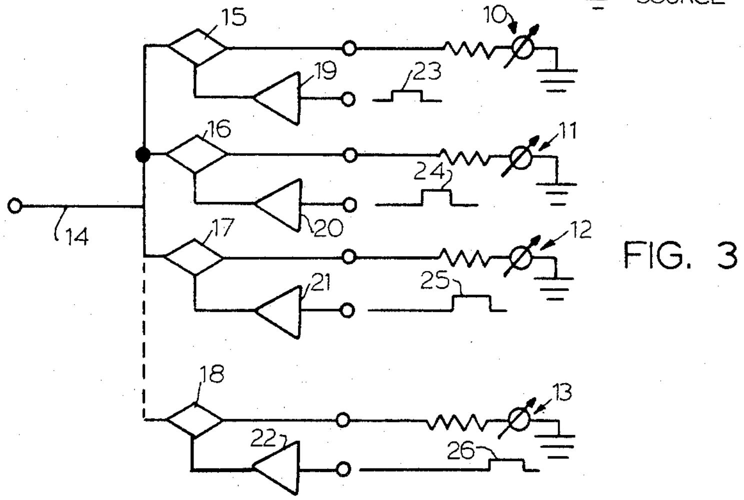
FIGURE 3 is a schematic illustration of an analog data sampling network employing circuits following the invention.

Prior to proceeding to a detailed description of FIGURE 1, reference is made to FIGURE 3 which schematically illustrates an analog data sampling network of a kind which may usefully employ the invention. In FIGURE 3, a number of analog data sources 10, 11, 12 and 13 for example and which may illustrate suitable transducers are multiplexed on a common output line 14 by sequential operation of a plural group of parallel switches, schematically illustrated at 15, 16, 17 and 18, which parallel switches are series connected on one side to the respective analog data sources 10, 11, 12 and 13 and on the other side to the common output line 14. These parallel switches are in turn gated by corresponding gate driver circuits 19, 20, 21 and 22 which respond to appropriate command signals indicated at 23, 24, 25 and 26. In applying the invention illustrated by FIGURES 1 and 2 to the FIGURE 3 circuit, the analog switching function of each of the mentioned parallel switches 15, 16, 17 and 18 may be performed by a field effect junction transistor (FET) and the mentioned gate driver circuits 19, 20, 21 and 22 may each be an FET analog gate driver circuit of the type illustrated by FIGURES 1 and 2. It is to be understood of course that FIGURE 3 represents merely one mode of operation of the invention and that the circuits of FIGURES 1 and 2 are generally applicable as gate driver circuits where the device to be switched partakes of the character of a field effect transistor.

To explain the background of the invention it is noted that in an analog switching application the analog source signal voltage may typically swing between zero and five volts positive. Where an FET P junction transistor is used as the switching device, the gate of the FET transistor may operate between 15 volts positive, at which the FET transistor is non-conducting, and zero volts, at which the FET is conducting, while the source voltage swings between zero and five volts positive. Thus when the 15 volts applied to the gate of the FET transistor drops to zero it is necessary to avoid excess gate current which would normally result when the gate voltage drops to zero and the source voltage rises above zero volts.

One simple form of isolation which is known is that of placing a diode in series with the FET gate terminal in a direction to oppose current flow through the gate terminal. Such a diode has several disadvantages among which are that the diode slows down the turn on effect of the gate and the diode does nothing towards solving the problem of discharging the inherent FET capacitance which exists between the source and gate ($C_{SG}$) and the drain and gate ($C_{DG}$) as illustrated in FIGURES 1 and 2.

A further approach to the problem of isolation involves connecting one side of a resistor between the mentioned isolating diode and the gate terminal and the other side to the drain of the FET. In this arrangement the capacitance $C_{SG}$ will discharge through the resistance and the capacitance $C_{DG}$ will discharge through the channel after the FET becomes conducting. This solution marks an improvement however a conducting path is always present through the diode and resistance which gives a so-called loading error in the readout. The value of the resistor may purposely be made large to reduce such error however this not only increases the time required to discharge the capacitance $C_{SG}$ and $C_{DG}$ but it also makes the circuit more difficult to put in integrated form. Employment of a capacitor in parallel with the isolating diode has also been proposed but has led to both transient loading or spike effects and undesired transient charges. A discussion of certain aspects of the foregoing may be found in a paper entitled "The Application of Junction Type Field Effect Transistors to High Level Time Division Multiplexing" by John O. Bowers, Jr. and Walter L. Elden given at the National Telemetering Conference at Houston, Texas on April 13, 14, 15, 1965.

With the foregoing in mind, attention is next directed to FIGURES 1 and 2 in which there are provided FET isolation circuits based on the use of an alterntting current (AC) coupled, grounded base, NPN switching transistor to discharge the junction capacity of a P channel junction FET as in FIGURE 1 and in FIGURE 2 the use of an AC coupled, grounded base, PNP switching transistor to discharge the junction capacity of an N channel junction FET. With more specific reference to FIGURE 1, the command signal is represented at 30 and by way of example is indicated as having a plus four volt fluctuation. This command signal is fed in on line 31 through current limiting resistor 71 and through an inverter-driver circuit represented by the dashed line box 32 and which consists of an NPN transistor 33 and a resistor 34. The emitter of transistor 33 and one side of resistor 34 are connected to a common ground or B− terminal 36. The command input signal line 31 connects with the base of transistor 33 and also connects with the other side of resistor 34.

The isolating circuit to which the invention is principally directed includes in the case of FIGURE 1 an NPN transistor 40, a capacitor 41, a diode 42 and a diode 43. The FET P channel junction switching element 45 includes gate, source and drain terminals labeled G, S and D respectively. The representative analog source is indicated at 46 and is connected to the source terminal S. While not shown connected in FIGURE 1, it will be understood that the drain terminal D is connected into a common network output line such as line 14 in FIGURE 3.

The base of transistor 40 is grounded through terminal 36. The emitter of transistor 40 is coupled through capacitor 41 to the collector of transistor 33. The emitter of transistor 40 is also connected to the anode side of diode 42 and through diode 42 to the ground terminal 36. The cathode side of diode 43 connects to a junction point 50 in a connecting line between the collector of transistor 40 and the FET gate terminal G. The anode side of diode 43 connects to a junction point 50 which in turn through the connecting lines shown connects through a resistor 52 to a B+ supply at 53 and further connects to a junction point 54 between capacitor 41 and the collector of transistor 33.

Before considering the operation of FIGURE 1 attention is directed to FIGURE 2 which is based on employment of an N channel junction FET designated at 60, a PNP transistor 61 and a PNP transistor 62. Comparing FIGURES 1 and 2 it will also be noted that diodes 42 and 43 in FIGURE 2 are arranged for opposite directions of current flow as compared to FIGURE 1. It will also be noted that the pinch off voltage used to keep the FET non-conducting is a B+ voltage in FIGURE 1 and a B− voltage in FIGURE 2 because of the inherent natures of the P channel junction and N channel junction FET's. It will also be noted that ground may be ground or B− at terminal 36 in FIGURE 1 and in FIGURE 2 may be ground or B+ and that the command signal 30 and the source signal from analog source 46 in FIGURE 1 are of opposite polarity to that in FIGURE 2. The description next proceeds to the operation of the FIGURE 1 circuit from which the operation of the FIGURE 2 circuit will become apparent. In regard to the following explanation, while typical voltage magnitudes are stated but not specific circuit values or constants are given, it should be understood that circuit constants are selected to obtain the functions and effects being explained and from such explanation those skilled in the art will readily recognize the circuit values required.

In FIGURE 1 which illustrates a typical analog application utilizing a P type FET, when the command input level applied to input terminal 70 is less than about .6 (six-tenths) above the voltage at terminal 36, no current is supplied to the base of transistor 33. Transistor 33 therefore does not conduct during this time and the voltage at junction point 50 is +15 volts supplied through resistor 52 and diode 43. This positive voltage which is applied at 53 keeps FET 45, the analog gate, pinched off so that there is no conduction between the drain terminal D and the source terminal S. FET 45 is turned on by supplying a pulse of +3 volts or greater amplitude, depending on the specific character of the inverter-driver 32, to input terminal 70, the command input. When this occurs, current is supplied to the base of transistor 33 and transistor 33 is driven into saturation. The saturation of transistor 33 reduces the voltage seen at junction point 51 to very nearly ground level. This removes the positive bias voltage supplied to junction point 50 and gate terminal G and the analog gate, i.e. FET 45, is biased toward conduction. In order to fully turn FET 45 on it is now necessary to discharge the FET 45 junction capacity.

Transistor 40, diode 42 and capacitor 41 are used to discharge the junction capacity of the FET analog gate. This is accomplished as follows. The reduced or negative going collector voltage of transistor 33 which appears at junction points 51 and 54 as transistor 33 is turned on is coupled to the emitter of transistor 40 by the capacitor 41. Since the voltage across capacitor 41 cannot change instantly the voltage appearing at junction point 55 moves negative. This turns on transistor 40 by reason of its emitter going negative with respect to its base. The voltages across capacitor 41 and across FET 45 capacitances $C_{SG}$ and $C_{DG}$ start decaying due to flow of current from junction point 50, which is driven towards ground, through transistor 40 and through capacitor 41. Capacitor 41 discharges until junction point 55 is moved to approximately negative .6 volts where diode 42 is reversed biased and therefore carries no current. Transistor 40 conducts during this very short interval of time (less than 1 microsecond) and then is tuned off by reason of the voltage decay on the capacitor 41 which time is also sufficient to discharge the junction capacitances $C_{SG}$ and $C_{DG}$. After this short interval of time required to discharge capacitor 41 and junction capacitances $C_{SG}$ and $C_{DG}$ has passed, FET 45 is left on but with a very high impedance path between the junction point 50 and ground terminal 36 and stays on so long as the command input stays above +3 volts. Therefore, in spite of the fact that the P-N junction of the analog gate is forward biased during the gate on time, the junction does not conduct since there is no path to ground except as is provided either through the back resistance of diode 43 or the collector to base junction of transistor 40 which is off except for an initial turn on transient. It may also be noted in connection with the circuit operation that the current path established for discharging the FET gate junction capacity charge is blocked when the capacitor 41 loses all of its charge as a result of being discharged through transistor 40. Diode 42 will not conduct until junction points 54 and 51 return to the B+ level (FIGURE 1) or B— level (FIGURE 2) as the case may be.

As compared to prior art practices it can be seen that the circuit of the invention exhibits the ability to turn the analog gate on very rapidly while preserving a very high degree of isolation between the analog source and the analog drive signal. Spiking and DC (direct current) loading on the analog source due to the analog gate drive signal are therefore held to a minimum.

Operation of the circuit in FIGURE 2 is identical to the operation of the circuit shown in FIGURE 1 and previously discused except that all voltage polarities are reversed. With this difference in mind, the explanation of the FIGURE 1 circuit applies directly to the operation of the FIGURE 2 circuit and will be readily understood. Circuit parameters in general are non-critical and will be readily apparent to those skilled in the art. Using FIGURE 1 as an example, it may be said that resistor 52 should have a large value to keep power consumption at a low level. Diode 43 should have, as reverse characteristics, low leakage and good recovery time and a breakdown voltage of 15 volts or greater. Forward characteristics are less critical. Diode 42 has no particular characteristic, either forward or reverse, that is deemed in any way critical. Transistor 40 characteristics may be defined as follows: $B \geqq 10$; 20 mc. minimum gain bandwidth product; low $I_{CBO}$; $V_{CBO} \geqq 15$ volts. The value of capacitor 41 is not critical above a certain minimum value roughly equal to $C_{SG}+C_{DG}$. However, the value should be held low to minimize the turn on spiking transient at the source.

Having described the invention, what I claim is:

1. In a switching circuit of the type which includes:

(a) a field effect transistor type switching element having gate, source and drain terminals;

(b) a B voltage source including a current limiting resistor connected to said gate terminal and effective to substantially block conduction between said source and drain terminals;

(c) a command signal input;

(d) a grounding terminal;

(e) a first diode connected between said voltage source and gate terminal;

(f) driver means responsive to said command signal input reaching a predetermined level and operative while such level is maintained to connect a first junction point between said voltage source and first diode to said ground terminal and during such connection being effective to turn said element on and make conducting the path between said source and drain terminals, said first diode being effective to oppose flow of current between said first junction point and said gate terminal during said such connection;

the improvement including in combination therewith:

(g) a second conventional switching transistor having emitter, collector and base terminals, said base terminal being connected to said ground terminal;

(h) a capacitor connected on one side to said first junction point and on the other side to said emitter, the collector of said switching transistor being connected to said gate terminal; and (i) a second diode connected between said grounding terminal and said emitter, said second transistor, capacitor and second diode being effective at the outset of said such connection to open a temporary first path through said second transistor and capacitor for discharging both said capacitor and the capacitive junction charge of said element while substantially blocking current flow through said second diode and upon completion of the discharge of said capacitor being followed by closing of said first path, restoring said first junction point to the level of said B voltage source and establishment of a second current path through said second diode and capacitor whereby to effect said capacitive junction discharge while maintaining substantial isolation between said command signal input and said source terminal.

2. In a switching circuit as claimed in claim 1 in which said field effect transistor switching element is a P type.

3. In a switching circuit as claimed in claim 1 in which said field effect transistor switching element is an N type.

4. In a switching circuit of the type which includes:

(a) a field effect type transistor switching element having gate, source and drain terminals;

(b) a B voltage source including a current limiting resistor connected to said gate terminal and effective to substantially block conduction between said source and drain terminals;

(c) a command signal input;

(d) a grounding terminal;

(e) a first diode connected between said voltage source and gate terminal;

(f) driver means responsive to said command signal input reaching a predetermined level and operative while such level is maintained to connect a first junction point between said voltage source and first diode to said ground terminal and during said such connection being effective to turn said element on and make conducting the path between said source and drain terminals, said first diode being effective to oppose flow of current between said first junction point and said gate terminal during said such connection;

the improvement comprising in combination therewith:

(g) circuit means effective to discharge the stored junction capacitance charge of said element while maintaining isolation between said source terminal and said command signal input, said circuit means including (1) a capacitor connected on one side to said first junction point, (2) a second diode connected between the other side of said capacitor and said ground terminal, and (3) switch means connected between said other side of said capacitor and said gate terminal and being operative at the outset of attaining said level for temporarily connecting said capacitor to said gate terminal, said temporary connection being effective to bias said second diode against conduction, to cause discharge of said capacitor through said switch means and to cause discharge of said stored junction capacitance charge through said capacitor followed by blocking of said temporary connection, restoring of said first junction point to the level of said B voltage source and recharging of said capacitor through said second diode.

5. In a switching circuit as claimed in claim 4 wherein said element is a P type.

6. In a switching circuit as claimed in claim 4 wherein said element is an N type.

7. In a switching circuit of the type which includes:
(a) a field effect type transistor switching element having gate, source and drain terminals;
(b) a B voltage source including a current limiting resistor connected to said gate terminal and effective to substantially block conduction between said source and drain terminals;
(c) a command signal input;
(d) a grounding terminal;
(e) a first diode connected between said voltage source and gate terminal;
(f) driver means responsive to said command signal input reaching a predetermined level and operative while such level is maintained to connect a first junction point between said voltage source and first diode to said ground terminal and during said such connection being effective to turn said element on and make conducting the path between said source and drain terminals, said first diode being effective to oppose flow of current between said first junction point and said gate terminal during said such connection;

the improvement comprising in combination therewith:
(g) circuit means effective to discharge the stored junction capacitance charge of said element while maintaining isolation between said source terminal and said command signal input, said circuit means including
(1) a capacitor,
(2) first means effective to connect said capacitor between said first junction point and said ground terminal whereby said capacitor is charged by said voltage source at all times except during a predetermined time following the attainment of said level, and
(3) second switching means connected between said capacitor and said gate terminal and being effective to disrupt the operation of said first means during said predetermined time and during such time to establish a path for discharging said capacitor through said second switching means and for discharging said stored junction capacitance charge through said capacitor, said second switching means being effective to open said path after said predetermined time.

8. A switching circuit comprising,
(a) a field effect transistor gate having source, drain and gate electrodes which is operative to pass a signal between its source and drain electrodes when enabled,
(b) means for applying operating voltage to said gate electrode for inhibiting said field effect transistor,
(c) a discharge circuit including a transistor connected between said gate electrode and a point of reference potential,
(d) means for applying said operating voltage to said transistor for inhibiting said discharge circuit, and
(e) an input circuit responsive to a command level connected to both said discharge circuit and said gate electrode for enabling said field effect transistor continuously during the period of said command level and said discharge circuit instantaneously at the onset of said command level.

References Cited

UNITED STATES PATENTS

| | | | |
|---|---|---|---|
| 3,215,859 | 11/1965 | Sorchych | 307—88.5 |
| 3,253,161 | 5/1966 | Owen | 307—88.5 |
| 3,325,654 | 6/1967 | Mrazek | 307—88.5 |

ARTHUR GAUSS, *Primary Examiner.*

B. P. DAVIS, *Assistant Examiner.*

UNITED STATES PATENT OFFICE

CERTIFICATE OF CORRECTION

Patent No. 3,414,737 December 3, 1968

John Oliver Bowers, Jr.

It is certified that error appears in the above identified patent and that said Letters Patent are hereby corrected as shown below:

In the heading to the printed specification, lines 4 to 6, "assignor to Dynatronics, Inc., Orlando, Fla., a corporation of Florida" should read -- assignor, by mesne assignments, to General Dynamics Corporation, a corporation of Delaware --.

Signed and sealed this 28th day of October 1969.

(SEAL)
Attest:

Edward M. Fletcher, Jr.
Attesting Officer

WILLIAM E. SCHUYLER, JR.
Commissioner of Patents